(12) United States Patent
Kymissis

(10) Patent No.: US 7,955,766 B2
(45) Date of Patent: Jun. 7, 2011

(54) SOFTWARE-CONTROLLED MASKLESS OPTICAL LITHOGRAPHY USING FLUORESCENCE FEEDBACK

(75) Inventor: Ioannis Kymissis, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 12/649,620

(22) Filed: Dec. 30, 2009

(65) Prior Publication Data
US 2010/0248099 A1    Sep. 30, 2010

Related U.S. Application Data

(63) Continuation of application No. PCT/US2008/008208, filed on Jul. 2, 2008.

(60) Provisional application No. 60/958,115, filed on Jul. 3, 2007.

(51) Int. Cl.
*G03F 9/00* (2006.01)
*G03B 27/52* (2006.01)

(52) U.S. Cl. ............... 430/30; 355/53; 355/55

(58) Field of Classification Search ............ 430/30; 355/53, 55
See application file for complete search history.

(56) References Cited

U.S. PATENT DOCUMENTS 6,249,381 B1 *   6/2001   Suganuma ............ 359/618
6,839,375 B1 *   1/2005   Lokai et al. ............ 372/92
2005/0219532 A1 * 10/2005   Mason ............... 356/401

FOREIGN PATENT DOCUMENTS

WO   WO-2005219532 A1   10/2005
WO   WO-2009/005808 A1   1/2009

OTHER PUBLICATIONS

"International Application Serial No. PCT/US2008/08208, International Search Report and Written Opinion Mailed on Sep. 29, 2008", P220, 10 Pgs.

Chan, Kin Foong, et al., "High-resolution maskless lithography", *J. Microlith., Microfab., Microsyst.*, 2(4), (Oct. 2003), 331-339.

Hastings, J. T., et al., "Nanometer-level stitching in raster-scanning electron-beam lithography using spatial-phase locking", *J. Vac. Sci. Technol. B*, 21(6), (Nov./Dec. 2003), 2650-2656.

Sandstrom, Tor, et al., "OML: optical maskless lithography for economic design prototyping and small-volume production", *Proceedings of SPIE*—vol. 5377, Optical Microlithography XVII, Bruce W. Smith, Editor, (May 2004), 777-787.

* cited by examiner

*Primary Examiner* — Christopher G Young

(74) *Attorney, Agent, or Firm* — Schwegman, Lundberg & Woessner, P.A.

(57) ABSTRACT

A software-controlled maskless optical lithography system uses fluorescence feedback to control an aspect of the lithography, such as light source dose, wavelength, or flashing instances or duration, spatial light modulator (SLM) pattern, an optics parameter, a beamsplitter control parameter, or movement or positioning of a stage carrying a target workpiece, such as a semiconductor wafer.

29 Claims, 3 Drawing Sheets

SOFTWARE-CONTROLLED MASKLESS OPTICAL LITHOGRAPHY USING FLUORESCENCE FEEDBACK

CLAIM OF PRIORITY

This application is a continuation application under 35 U.S.C. 111(a) of PCT/US2008/008208, filed Jul. 2, 2008 and published as WO 2009/005808 on Jan. 8, 2009, which claimed priority under 35 U.S.C. §119(e) to U.S. Provisional Patent Application Ser. No. 60/958,115, filed Jul. 3, 2007, which applications and publication are incorporated herein by reference and made a part hereof

TECHNICAL FIELD

This document pertains generally to lithography, and more particularly, but not by way of limitation, to software-controlled maskless optical lithography using fluorescence feedback.

BACKGROUND

Lithography involves forming a pattern on an object. Uses of lithography include manufacturing of semiconductor wafers, high density printed circuit boards, high definition liquid crystal displays (LCDs), microelectromechanical systems (MEMS), among other things. For example, in semiconductor wafer manufacturing, photolithography ("optical lithography") can be performed using a mask to selectively expose a pattern on photoresist (PR) on a target semiconductor substrate. The optical exposure can change a physical property of the PR in the patterned region. After modifying the PR in the patterned region, an appropriate chemical can be used to selectively remove ("develop") the PR (e.g., the patterned region of PR, or the inverse of the patterned region of PR). In certain examples, an etchant can then be used to selectively remove exposed material.

OVERVIEW

Mask-based optical lithography can involve considerable expense in mask generation. Maskless optical lithography can be performed to selectively expose a PR layer on a semiconductor substrate to light without requiring a mask. For example, a spatial light modulator (SLM) can be used to selectively expose the PR layer without requiring a mask. As an example of an SLM, a digital micromirror device (DMD) can selectively direct a pattern of light in a path toward a substrate. Reduction optics can be inserted into the path to reduce the size of the image pattern. The present inventor has recognized, among other things, maskless optical lithography can benefit from improved accuracy. A system designer can also leverage such improved accuracy to obtain faster throughput or lower cost.

For example, maskless optical lithography may require an expensive high-precision stage carrying the target substrate. The high-precision stage is moved with respect to the SLM to serially expose different regions of the target substrate. Even using an interferometer-controlled high precision stage, there can be a registration inaccuracy of the actual and desired locations of the light from the SLM upon the target substrate—particularly if the target substrate has not thermally stabilized with respect to the stage. The present inventor has recognized, among other things, that optical feedback information from the target substrate can be used to control one or more aspects of the lithography, such as movement of a stage carrying the target substrate, as one illustrative example. As an example of such optical feedback information, a fluorescence signal detected from the target substrate, can be used to provide a feedback signal, which can be used to control one or more aspects of the lithography, as explained below.

Example 1 describes an optical lithography apparatus comprising: a light source, configured to deliver light to a target substrate; a light detector, configured to detect a fluorescence feedback signal from the substrate in response to light delivered to the substrate from the light source; and a controller circuit, configured to receive information about the feedback signal from the light detector, and to use the information about the feedback signal to automatically adjusting at least one aspect of the lithography.

In Example 2, the apparatus of Example 1 optionally comprises: a spatial light modulator; a lens; and a beam splitter, between the spatial light modulator and the lens, the beamsplitter configured to direct light, received from the substrate via the lens, to the light detector.

In Example 3, the apparatus of any one or more of Examples 1-2 optionally comprises an optical microscope providing the lens.

In Example 4, the apparatus of any one or more of Examples 1-3 optionally comprises:
a red light source; a green light source; a blue light source. The red, green, and blue light sources can be independently controllable.

In Example 5, the apparatus of any one or more of Examples 1-4 optionally comprises a solid-state light source.

Example 6 describes an optical lithography apparatus comprising: a light source, configured to provide light at a first wavelength to expose a photoresist of a target substrate, and configured to provide light at a second wavelength to induce a fluorescence response from the target substrate without exposing the photoresist of the target substrate; a spatial light modulator (SLM), configured to controllably direct light from the light source at the first or second wavelengths to desired locations of the photoresist of the target substrate; a fluorescence response detector, configured to detect a fluorescence response from the target substrate in response to light at the second wavelength received at the target substrate; and a controller circuit, configured to use information about the fluorescence response to control an aspect of lithography performed on the target substrate.

In Example 7, the apparatus of Example 6 optionally comprises the controller circuit being configured to use information about the fluorescence response to control movement of a stage carrying the target substrate.

In Example 8, the apparatus of any one or more of Examples 6-7 optionally comprises the stage.

In Example 9, the apparatus of any one or more of Examples 6-8 optionally comprises the controller circuit being configured to use information about the fluorescence response to control operation of the light source.

In Example 10, the apparatus of any one or more of Examples 6-9 optionally comprises the controller circuit being configured to use information about the fluorescence response to control a light dose provided by the light source.

In Example 11, the apparatus of any one or more of Examples 6-10 optionally comprises the controller circuit being configured to use information about the fluorescence response to control a flashing of the light source.

In Example 12, the apparatus of any one or more of Examples 6-11 optionally comprises the controller circuit being configured to use information about the fluorescence response to control an image provided to the SLM.

In Example 13, the apparatus of any one or more of Examples 6-12 optionally comprises the controller circuit being configured to use information about the fluorescence response to control direction of the light between the SLM and the target substrate.

In Example 14, the apparatus of any one or more of Examples 6-13 optionally comprises the spatial light modulator including a digital micromirror device (DMD) that is controlled by the controller using information about the fluorescence response.

In Examples 15, the apparatus of any one or more of Examples 6-14 optionally comprises a maskless optical lithography apparatus.

In Example 16, the apparatus of any one or more of Examples 6-15 optionally comprises microscope or reduction optics located between the SLM and the target substrate.

In Example 17, the apparatus of any one or more of Examples 6-16 optionally comprises a beamsplitter located between the SLM and the target substrate.

In Example 18, the apparatus of any one or more of Examples 6-17 optionally comprises a fluorescence response detector comprising a light detector configured to detect the fluorescence response as reflected by a beamsplitter.

Example 19 describes an optical photolithography method comprising: selectively exposing a target substrate to a light source, the selectively exposing including automatically directing light from the light source toward the substrate under programmatic control; measuring a fluorescence signal from the substrate in response to light directed from the light source toward the substrate; and using the fluorescence signal as a feedback signal to control the selectively exposing the substrate to the light source.

In Example 20, the method of Example 19 optionally comprises spatially modulating the light from the light source to deliver light to the substrate.

In Example 21, the method of any one or more of Examples 19-20 optionally comprises using the fluorescence signal as a feedback signal to control movement of a stage carrying the substrate.

In Example 22, the method of any one or more of Examples 19-21 optionally comprises using the fluorescence signal as a feedback signal to control operation of the light source.

In Example 23, the method of any one or more of Examples 19-22 optionally comprises using the fluorescence signal as a feedback signal to control a light dose provided by the light source.

In Example 24, the method of any one or more of Examples 19-23 optionally comprises using the fluorescence signal as a feedback signal to control a flashing of the light source.

In Example 25, the method of any one or more of Examples 19-24 optionally comprises using the fluorescence signal as a feedback signal to control an image provided to a spatial light modulator (SLM).

In Example 26, the method of any one or more of Examples 19-25 optionally comprises using the fluorescence signal as a feedback signal to control direction of the light between the SLM and the target substrate.

Example 27 describes an optical photolithography apparatus comprising: means for selectively exposing a target substrate to a light source, the selectively exposing including automatically directing light from the light source toward the substrate under programmatic control; means for measuring a fluorescence signal from the substrate in response to light directed from the light source toward the substrate; and means for using the fluorescence signal as a feedback signal to control the selectively exposing the substrate to the light source.

Example 28 describes a method comprising: providing light at a first wavelength to expose a photoresist of a target substrate; providing light at a second wavelength to induce a fluorescence response from the target substrate without exposing photoresist of the target substrate; controllably directing light at the first and second wavelengths to desired locations of the photoresist of the target substrate; detecting a fluorescence response from the target substrate in response to light at the second wavelength received at the target substrate; and using information about the fluorescence response to control an aspect of lithography performed on the substrate.

In Example 29, the method of Example 28 optionally comprises using information about the fluorescence response to control movement of a stage carrying the target substrate.

In Example 30, the method of any one or more of Examples 28-29 optionally comprises using information about the fluorescence response to control the providing of the light.

In Example 31, the method of any one or more of Examples 28-30 optionally comprises using information about the fluorescence response to control a flashing when providing the light.

In Example 32, the method of any one or more of Examples 28-31 optionally comprises using information about the fluorescence response to control an image provided to a spatial light modulator (SLM).

In Example 33, the method of any one or more of Examples 28-32 optionally comprises using information about the fluorescence response to control direction of the light toward the target substrate.

In Example 34, the method of any one or more of Examples 28-33 optionally comprises using a digital micromirror device (DMD) that is controlled using information about the fluorescence response.

In Example 35, the method of any one or more of Examples 28-34 optionally comprises performing maskless lithography on the target substrate.

In Example 36, the method of any one or more of Examples 28-35 optionally comprises performing a beamsplitting of light communicated with the target substrate.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
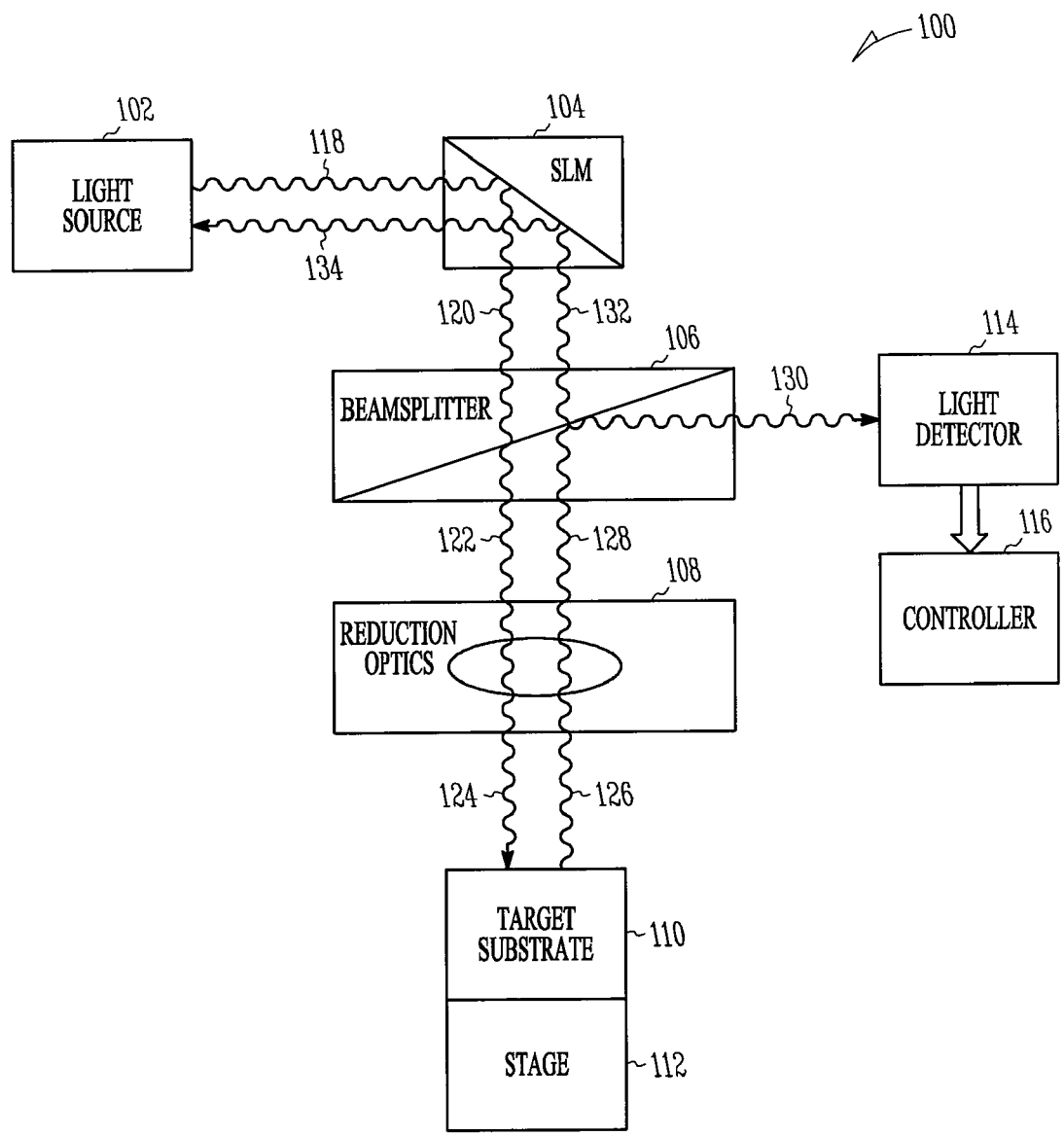
FIG. 1 is a schematic drawing showing generally an example of a system for performing optical lithography, and portions of an environment in which it can be used.

FIG. 1 is a schematic drawing showing generally an example of a system 100 for performing optical lithography, and portions of an environment in which it can be used. The example of FIG. 1 includes a light source 102, a spatial light modulator (SLM) 104, a beamsplitter 106, reduction optics 108, a target substrate 110 carried by a stage 112, and a light detector 114. A controller 116 can programmatically control one or more aspects of the lithography. This can involve programmatically controlling operation of one or more of the light source 102, the SLM 104, the beamsplitter 106, the reduction optics 108, the stage 112, or the light detector 114, such as by using as a feedback signal a fluorescence or other optical response signal detected by the light detector 114 from the target substrate 110.

In certain examples, the light source 102 includes independently controllable red, green, and blue wavelength light sources, such as solid-state light-emitting diode (LED) light sources or laser light sources. FIG. 1 illustrates light 118 delivered from the light source 102 to the SLM 104. The light 118 can include light for performing the optical lithography on the target substrate 110, for exciting the fluorescence or other optical response signal from the target substrate 110, or both. The SLM 104 converts the received light 118 into spatially patterned light 120 that is provided to the target substrate via the beamsplitter 106 and the reduction optics 108. In certain examples, the SLM 104 can include a digital micromirror device (DMD). In an example, the DMD can include a microelectromechanical system (MEMS) array of mirrors. Each mirror can be aimed to either direct the light on-axis toward the target substrate, or off-axis such that its directed light will not reach the target substrate. As an illustrative example, Texas Instruments manufactures a super video graphic array (SVGA) 848×600 mirror DMD having a pitch size of 17 micrometers between mirrors. Each micromirror can be addressed, such as by CMOS switches, and includes a corresponding charge storage element upon which an analog charge can be stored to control a deflection of the minor. Depending on the stored charge, the mirror can be deflected to up to +/−10 degrees off their normal "flat" position in which light is directed on-axis toward the target substrate 110. Other suitable DMDs or other SLMs can also be used. The mirrors can be operated as binary or grayscale reflectors, as desired, by adjusting the charge stored on the corresponding charge-storage element. In certain examples, the mirrors can be individually calibrated, such as to adjust their normal "flat" position to ensure that light is directed on-axis The beamsplitter 106 can include a dichroic element that is designed to pass a spatially patterned image of light 122, such as at one or more wavelengths desired for exposing selected regions of a photoresist (PR) top layer on the target substrate 110. The spatially patterned image of light 122 is demagnified by a microscope or other reduction optics 108 to provide a reduced-size spatially patterned image of light 124 to define the desired feature sizes on the PR of the target substrate 110. Reflected or fluorescence light 126 is emitted from the target substrate 110, such as in response to the spatially patterned image of light 124 or other incident light. This light 126 is delivered to the reduction optics 108, where it is magnified into the light 128 that is delivered to the beamsplitter. In the example of FIG. 1, the dichroic element of the beamsplitter 106 reflects a fluorescence component 130 of the light 128 (which is red-shifted to longer wavelengths than the reflected component of the light 128) toward the light detector 114, and passes a reflected component 132 of the light 128 back to the SLM 104, which is in turn reflected back as light 134 toward the light source 102. In this example, information about the fluorescence component 130 detected by the light detector 114 is provided to the controller 116, where it is signal-processed and used as a feedback signal to control one or more aspects of the lithography. Other components may also be included in the system 100 of FIG. 1. For example, an aperture can be used to block the off-axis components of the light 120 emitted by the SLM 104, if desired. Variations on the arrangement shown in FIG. 1 are also possible. For example, light from the light source 120 can be delivered to an angled mirror and directed toward an SLM 104 that is orthogonal to a direction of light emitted from the SLM 104 toward the target substrate 110. The arrangement of FIG. 1 is merely an example provided as one conceptual illustration of the present systems and methods.

Figure 2:
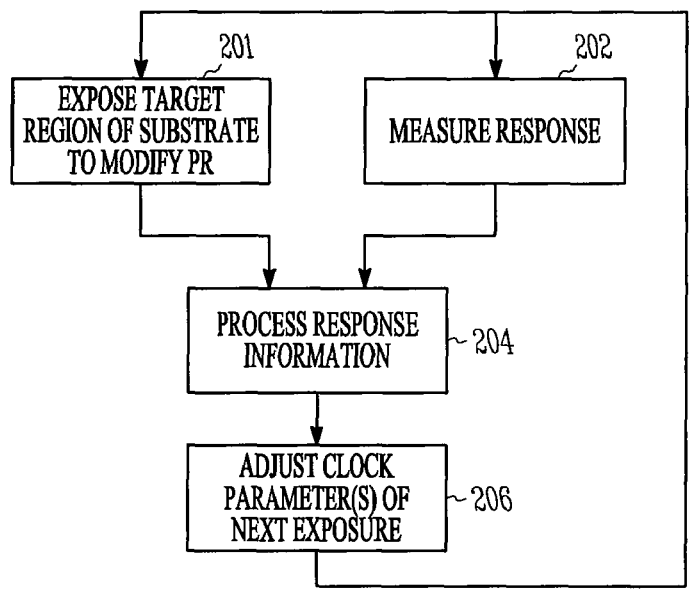
FIG. 2 is a diagram illustrating an example in which a fluorescence component from the target substrate is detected by the light detector 114 concurrent with pulsed delivery of light from the light source.

FIG. 2 is a diagram illustrating an example in which, at 202, the fluorescence component 130 from the target substrate is detected by the light detector 114 concurrent with pulsed delivery of light 118 from the light source 102, at 201, at one or more wavelengths that are selected to expose the PR on the target substrate 110. At 204, the response information, such as the fluorescence component 130 information, is processed, such as for determining whether the PR has been adequately exposed. At 206, such information is used to adjust one or more control parameters of a next exposure, such as to control the dose of a next pulse of light 118 to the same region of the target substrate 110. This can be repeated, as necessary, to obtain a desired cumulative exposure of the target region of the PR as determined from the information obtained from fluorescence component 130.

Figure 3:
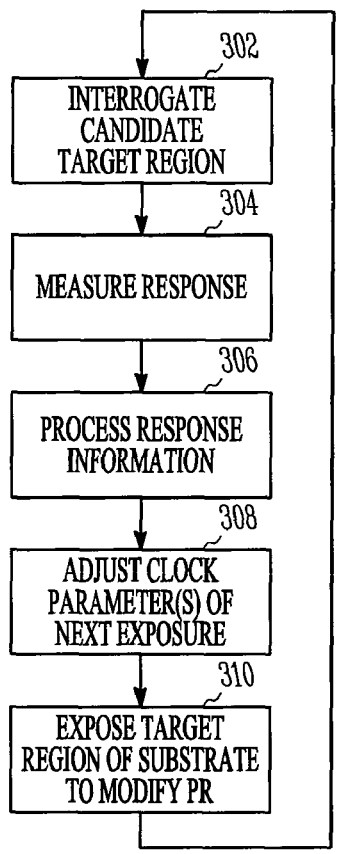
FIG. 3 is a diagram illustrating an example in which the fluorescence component from the target substrate can be detected by the light detector outside of a time period during which the photoresist (PR) on the target substrate is exposed to light that modifies the PR.

FIG. 3 is a diagram illustrating an example in which the fluorescence component 130 from the target substrate can be detected by the light detector 114 outside of a time period during which the PR on the target substrate is exposed to light that modifies the PR. For example, before exposing a particular target region of the substrate, it may be desirable to determine whether the stage 112 has properly positioned the target substrate to the desired region to be exposed. Already-exposed PR will exhibit "bleaching," that is, less fluorescence will be emitted from already-exposed PR than from unexposed PR. This information can be used to distinguish between regions of unexposed and already-exposed PR, such as, for example, to determine the location of the target region of the target substrate, such as to avoid overexposing a PR region that has already been exposed.

At 302, a candidate target region for exposure is "interrogated," such as by emitting from the light source 102 light at one or more "interrogation-only" wavelengths that do not modify the PR. The "interrogation-only" wavelengths instead produce a fluorescence response that can be measured at 304, such as to distinguish between exposed and unexposed regions of PR, or to obtain fluorescence from any underlayer feature such as, for example, an alignment marking. In certain examples, the light detector 114 is a camera or other imager that can produce an image of the fluorescence response from the target substrate. At 306, the fluorescence response information is processed. At 308, the fluorescence response information can be used to adjust one or more control parameters of the next exposure. For example, fluorescence imaging information can be used by the controller 116 to programmatically control movement of the stage 112 to align or otherwise "stitch" a particular target region to an adjacent already-selectively-exposed region. This can ensure continuity of modified PR features that cross the current and previously-exposed adjacent target regions. This can be accomplished by using the fluorescence imaging information for controlling movement of the stage to position the target substrate 110 in such desired alignment with an adjacent already-selectively-exposed region. At 310, the target region of the substrate can then be exposed, such as by switching the light source from an "interrogation only" wavelength to one or more PR modifying wavelengths. The examples of FIGS. 2 and 3 can be combined, such as to flash a particular target region multiple times, using the fluorescence response information to control dose or another lithography parameter, and to use the fluorescence imaging information to align and "stitch" the next target region to the previous target region.

Figure 4:
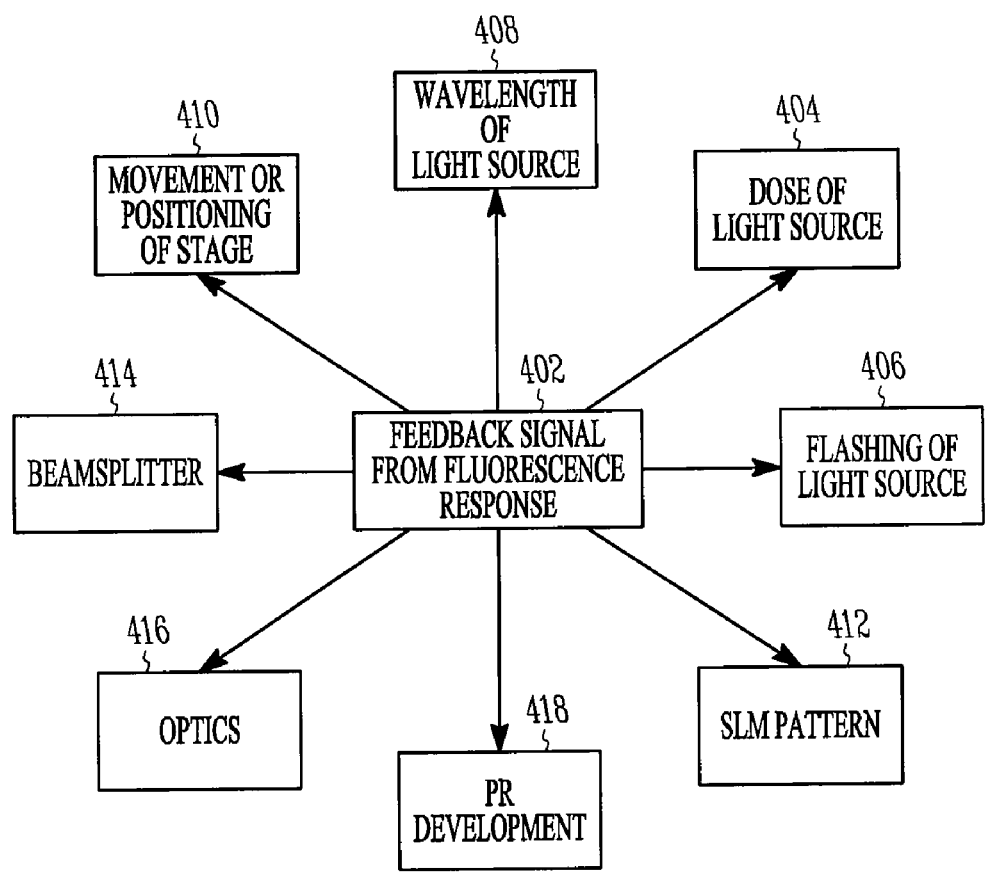
FIG. 4 is a diagram illustrating generally an example of various aspects of the lithography that can be programmatically controlled, individually or in combination, such as by using information from the fluorescence response feedback signal from the substrate.

FIG. 4 is a diagram illustrating generally an example of various aspects of the lithography that can be programmatically controlled, individually or in combination, such as by using information from the fluorescence response feedback signal from the substrate at 402. At 404, a dose of the light source 102 is controlled based on the fluorescence information, such as by increasing or decreasing a light intensity during a particular flashing of the light source 102. At 406, a flashing of the light source 102 is controlled based on the fluorescence information, such as by controlling a number of flashes per target region, or a duration of a particular flash of the target region. At 408, a wavelength of the light source 102 is controlled based on the fluorescence information, such as to switch between an interrogation wavelength (which does not modify the PR), and a modifying wavelength (which does modify the PR), or to adjust either. At 410, a movement or positioning of the stage 112 is adjusted based on the fluorescence information, such as to align a current target region to an adjacent previously-exposed target region, for example, to stitch one or more features of the current target region to one or more corresponding features of the previously-exposed target region. At 412, an SLM pattern is controlled based on the fluorescence information. For example, in an example using a DMD, if a target region corresponding to a particular mirror is fully exposed according to the fluorescence imaging information, then deflection of that particular mirror can be adjusted so that its light is shifted from on-axis to off-axis, so that its light does not reach the PR layer on the target substrate 110. At 414, the beamsplitter is adjusted based on the fluorescence information, such as to select a particular wavelength from the light source 102 to be passed or reflected. At 416, the optics 108 are adjusted based on the fluorescence information, such as to adjust an aperture, focal length, to compensate for optical aberration, or the like. At 418, the aspect of the lithography that is controlled or adjusted based on the fluorescence information includes the PR development. For example, since the fluorescence information can yield information about PR thickness and degree of exposure, such information can be used to adjust PR development, such as the duration for which the PR is developed (e.g., using a chemical PR developer), the chemical used or its concentration, or any other aspect of the PR development process.

Although the above explanation has emphasized certain examples in the context of semiconductor wafer processing, using the fluorescence response as a feedback signal to control optical lithography is useful in numerous other contexts, such as, by way of example, but not by way of limitation, making high density printed circuit boards, high definition liquid crystal displays (LCDs), microelectromechanical systems (MEMS), reticles, masks, compact disk (CD) masters, digital video disk (DVD) masters, or diffraction gratings, among other things.

Additional Notes

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An optical lithography apparatus comprising:
   a light source, configured to deliver light to a target substrate;

a spatial light modulator (SLM), configured to controllably direct light from the light source to desired locations associated with the target substrate for performing lithography;

a light detector, configured to detect a fluorescence feedback signal from the substrate in response to light delivered to the substrate from the light source; and a controller circuit, configured to receive information about the feedback signal from the light detector, and to use the information about the feedback signal to automatically adjusting at least one aspect of the lithography being performed using the SLM.

2. The apparatus of claim 1, comprising:
a lens; and
a beam splitter, between the spatial light modulator and the lens, the beamsplitter configured to direct light, received from the substrate via the lens, to the light detector.

3. The apparatus of claim 2, comprising an optical microscope providing the lens.

4. The apparatus of claim 1, wherein the light source comprises:
a red light source;
a green light source;
a blue light source; and
wherein the red, green, and blue light sources are independently controllable.

5. The apparatus of claim 4, wherein at least one of the red, green, or blue light sources includes a solid-state light source.

6. An optical lithography apparatus comprising:
a light source, configured to provide light at a first wavelength to expose a photoresist of a target substrate, and configured to provide light at a second wavelength to induce a fluorescence response from the target substrate without exposing the photoresist of the target substrate for performing lithography;

a spatial light modulator (SLM), configured to controllably direct light from the light source at the first or second wavelengths to desired locations of the photoresist of the target substrate;

a fluorescence response detector, configured to detect a fluorescence response from the target substrate in response to light at the second wavelength received at the target substrate; and a controller circuit, configured to use information about the fluorescence response to control an aspect of lithography performed on the target substrate using the SLM.

7. The apparatus of claim 6, wherein the controller circuit is configured to use information about the fluorescence response to control movement of a stage carrying the target substrate.

8. The apparatus of claim 7, comprising the stage.

9. The apparatus of claim 6, wherein the controller circuit is configured to use information about the fluorescence response to control operation of the light source.

10. The apparatus of claim 9, wherein the controller circuit is configured to use information about the fluorescence response to control a light dose provided by the light source.

11. The apparatus of claim 9, wherein the controller circuit is configured to use information about the fluorescence response to control a flashing of the light source.

12. The apparatus of claim 9, wherein the controller circuit is configured to use information about the fluorescence response to control an image provided to the SLM.

13. The apparatus of claim 6, wherein the controller circuit is configured to use information about the fluorescence response to control direction of the light between the SLM and the target substrate.

14. The apparatus of claim 6, wherein the spatial light modulator includes a digital micromirror device (DMD) that is controlled by the controller using information about the fluorescence response.

15. The apparatus of claim 6, wherein the apparatus is a maskless optical lithography apparatus.

16. The apparatus of claim 6, comprising microscope optics located between the SLM and the target substrate.

17. The apparatus of claim 6, comprising a beamsplitter located between the SLM and the target substrate.

18. The apparatus of claim 17, wherein the fluorescence response detector comprises a light detector configured to detect the fluorescence response as reflected by the beamsplitter.

19. An optical photolithography method comprising:
selectively exposing a target substrate to a light source, including spatially modulating light using a spatial light modulator (SLM) for performing lithography, the selectively exposing including automatically directing light from the light source toward the substrate, at least in part using the SLM, under programmatic control;

measuring a fluorescence signal from the substrate in response to the light directed from the light source toward the substrate at least in part using the SLM; and using the fluorescence signal as a feedback signal to control the selectively exposing the substrate to the light source for the lithography being performed using the SLM.

20. The method of claim 19, comprising using the fluorescence signal as a feedback signal to control movement of a stage carrying the substrate.

21. The method of claim 19, comprising using the fluorescence signal as a feedback signal to control operation of the light source.

22. The method of claim 21, comprising using the fluorescence signal as a feedback signal to control a light dose provided by the light source.

23. The method of claim 21, comprising using the fluorescence signal as a feedback signal to control a flashing of the light source.

24. The method of claim 19, comprising using the fluorescence signal as a feedback signal to control an image provided to a spatial light modulator (SLM).

25. The method of claim 19, comprising using the fluorescence signal as a feedback signal to control direction of the light between the SLM and the target substrate.

26. The method of claim 19, comprising:
providing light at a first wavelength to expose a photoresist of a target substrate;
providing light at a second wavelength to induce a fluorescence response from the target substrate without exposing photoresist of the target substrate;
controllably directing light at the first and second wavelengths to desired locations of the photoresist of the target substrate;
detecting a fluorescence response from the target substrate in response to light at the second wavelength received at the target substrate; and
using information about the fluorescence response to control an aspect of lithography performed on the substrate.

27. The method of claim 26, comprising using a digital micromirror device (DMD) that is controlled using information about the fluorescence response.

28. The method of claim 26, wherein the lithography performed on the target substrate is maskless.

29. The method of claim 26, comprising performing a beamsplitting of light communicated with the target substrate.

* * * * *